(12) United States Patent
Jang et al.

(10) Patent No.: US 6,664,195 B2
(45) Date of Patent: Dec. 16, 2003

(54) METHOD FOR FORMING DAMASCENE METAL GATE

(75) Inventors: Se Aug Jang, Kyoungki-do (KR); Jun Hyeub Sun, Seoul (KR); Hyung Bok Choi, Kyoungki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 09/974,811

(22) Filed: Oct. 12, 2001

(65) Prior Publication Data

US 2002/0064964 A1 May 30, 2002

(30) Foreign Application Priority Data

Oct. 13, 2000 (KR) ..................... 2000-0060417

(51) Int. Cl.$^7$ ............................. H01L 21/302
(52) U.S. Cl. ................. 438/745; 438/750; 438/751; 438/754
(58) Field of Search ................. 438/745, 747, 438/750, 751, 754, 652, 672, 675, 243, 183

(56) References Cited

U.S. PATENT DOCUMENTS 5,869,866 A * 2/1999 Fulford, Jr. et al. ........ 257/347
5,942,449 A * 8/1999 Meikle ....................... 438/747
5,960,270 A * 9/1999 Misra et al. ................ 438/197

OTHER PUBLICATIONS

Yagishita et al., "High Performance Damascene Metal Gate MOSFET's for 0.1 μm Regime", IEEE Transactions on Electron Devices, vol. 47, No. 5, May 2000, pp. 1028–1034.
Yagishita et al., "High Performance Metal Gate MOSFET's Fabricated by CMP for 0.1 μm Regime", IEEE IEDM 98—International Electron Devices Meeting, 1998, pp. 785–788.
Matsuki et al., "Cu/poly–Si Damascene Gate Structured MOSFET with Ta and TaN Stacked Barrier", IEEE IEDM–99, 1999, pp. 261–264.
Matsuo et al., "Damascene Metal Gate MOSFET's with Co Silicided Source/Drain and High–k Gate Dielectrics", IEEE 2000 Symposium on VLSI Technology Digest of Technical Papers, 2000, 2 pages.

* cited by examiner

Primary Examiner—Benjamin L. Utech
Assistant Examiner—Lan Vinh
(74) Attorney, Agent, or Firm—Pillsbury Winthrop LLP

(57) ABSTRACT

The present invention relates to a method of forming a damascene gate electrode of highly integrated MOS transistor capable of easily removing a dummy polysilicon layer. The disclosed comprises the steps of forming a dummy gate insulating layer and a polysilicon layer for a dummy gate on a wafer; forming an interlayer insulating layer on the wafer; polishing the interlayer insulating layer to expose a top surface of the dummy polysilicon layer; and wet etching the exposed dummy polysilicon layer using a spin etching process.

10 Claims, 7 Drawing Sheets

US 6,664,195 B2

METHOD FOR FORMING DAMASCENE METAL GATE

BACKGROUND OF THE INVENTION

1. Field of the Invention

The present invention relates to a method for forming highly integrated semiconductor devices and, more particularly, a method for forming damascene gate electrodes for highly integrated MOS transistors that includes effectively removing a dummy polysilicon layer.

2. Description of the Related Art

In general, a polysilicon gate electrode and a polycide gate electrode have been used as a gate electrode in sub-0.10 micron devices. However, polysilicon gate are associated with problems such as increases in the effective thickness of the gate insulating layer caused by gate depletion and threshold voltage variations resulting from dopant penetration from $p^+$ or $n^+$ polysilicon gate to a substrate and/or variations in dopant distribution. Further, it has proven difficult to produce consistent low-resistance conductors having extremely narrow line widths.

Therefore, metal gate electrodes are being developed as a substitute for the conventional polysilicon gate electrodes. Metal gate electrodes can solve the above-mentioned problems by eliminating the need for dopant in the manufacturing process. Metal gate electrodes, therefore, are able to provide threshold voltages that are symmetric between the NMOS and PMOS regions of a CMOS device by using metals that exhibit a work function located in a mid-band gap of silicon. Such metals include tungsten (W), tungsten nitride (WN), titanium (Ti), titanium nitride (TiN), molybdenum (Mo) and tantalum (Ta).

However, it has proven difficult to pattern metal gate electrodes. Also, during the subsequent ion implantation process necessary to form the source and drain regions, the surface of the metal film may be damaged. And similarly, the metal film may be subjected to thermal damage during the thermal process after ion implantation necessary to activate the dopants and/or anneal the crystal damage.

In order to solve these problems, a method has been proposed for forming a metal gate electrode using a damascene metal gate process. In the damascene metal gate process, a polysilicon gate is formed as a dummy gate and then source/drain regions are formed, thereby completing a transistor. The polysilicon gate is then removed and a metal gate is formed using a damascene process.

FIGS. 1A to 1F show a conventional method of forming a damascene metal gate.

Referring to FIG. 1A, a silicon oxide layer and a polysilicon layer are formed on a wafer (10), that is, a silicon substrate in a conventional method of forming polysilicon gate electrode and then, the layers are subjected to a patterning process, thereby forming a dummy gate insulating layer (11) and a dummy gate electrode (12).

Subsequently, source/drain regions (13) are formed by implanting ion impurities and spacers (14) are formed on the sidewalls of the dummy gate insulating layer (11) and the dummy gate electrode (12). Here, the source/drain regions may be formed using a LDD (Lightly Doped Drain) structure by the following steps. Firstly, a dummy gate electrode (12) is formed and then, source/drain regions are implanted with a low dopant concentration. Sidewall spacers (14) are then formed and the source/drain regions are implanted a high dopant concentration.

Referring to FIG. 1B, an interlayer insulating layer (15) is then formed over the resulting structure. The interlayer insulating layer (15) is then subjected to a chemical mechanical polishing (CMP) process as shown in FIG. 1C to remove a top portion of the interlayer insulating layer and expose the surfaces of dummy gate electrodes (12).

Referring to FIG. 1D, exposed dummy gate electrode (12) and dummy gate insulating layer (11) are selectively etched to expose the substrate (10). The removal of the dummy gate electrode (12) and the dummy gate insulating layer (11) produces a trench (16).

Referring to FIG. 1E, a thin insulating layer (17) and a metal layer (18), such as a tungsten layer, are formed on the interlayer insulating layer (15) trench (16). The interlayer insulating layer (15) is then exposed by CMP process, thereby forming a damascene gate insulating layer (19) and a damascene metal gate electrode (20).

The above-mentioned method of forming a damascene metal gate electrode provides certain advantages by deferring the gate electrode formation until after the transistor source/drain regions have been formed. For example, it is possible to avoid both plasma damage from the ion implantation processes and thermal damage that can occur during the follow-up thermal processes.

FIGS. 1A to 1D show process steps for selectively removing the polysilicon layer forming dummy gate (12). It is important to prevent damage of sidewall spacers (14) and the interlayer insulating layer (15) during the process of removing the polysilicon layer and it is particularly important to prevent damage to the exposed portion of the silicon substrate (10). Further, all residue from the polysilicon layer must be completely eliminated from the trench (16).

FIGS. 2A and 2B show a conventional method of removing a dummy polysilicon layer for a dummy gate electrode. FIG. 2A shows a conventional method of removing a dummy polysilicon layer using a dry etch process and FIG. 2B shows a method using a wet etch process. In FIG. 2A, the dummy polysilicon layer is etched back and then removed using a plasma etch. FIG. 2B illustrates a method in which the dummy polysilicon layer is removed by a static etch process, that is, by dipping wafers (22) into a wet chemical etch bath (21) for a predetermined time.

However, these conventional methods of removing dummy polysilicon layers have certain problems.

First, plasma damage is caused on a wafer (10) when the trench (16 of FIG. 1D) is formed by etching a dummy polysilicon layer. Further, a post-process treatment is required to remove polymers generated during the dry etch back process.

The wet etch process using the wet chemical is preferred to a dry etch process since it prevents plasma damage of substrate and it is an isotropic etch process. However, the wet etch process is advantageous only when the etch chemistry is such that the polysilicon layer is etched much more rapidly than the other layers that are exposed to the etch.

SUMMARY OF THE INVENTION

Therefore, the present invention has been made in order to solve the above-mentioned problems in the prior art. An object of the present invention is to provide a method for forming a damascene metal gate in which a dummy polysilicon layer is etched rapidly using a spin etch process.

In order to achieve the above object, the method for forming a damascene metal gate according to the present invention is characterized by the steps of: forming a dummy gate insulating layer and a polysilicon layer for a dummy gate on a wafer; forming an interlayer insulating layer on the wafer having the dummy polysilicon layer; polishing the interlayer insulating layer to expose a top of surface of the dummy polysilicon layer; and wet etching the exposed dummy polysilicon layer using a spin etch process.

According to the present invention, the dummy polysilicon layer is spin etched by providing wet chemicals to the surface of the dummy polysilicon layer while rotating the wafer.

Here, the speed of rotation of the wafer is 500 to 2000 rpm and a mixture of HF and $HNO_3$ is used as the wet chemical at a rate of 1:10 to 1:50 with the temperature of the wet etch chemical solution being between 20 and 100° C.

DETAILED DESCRIPTION OF THE INVENTION

The above objects, and other features and advantages of the present invention will become more apparent after reading the following detailed description when taken in conjunction with the drawings.

Figure 3:
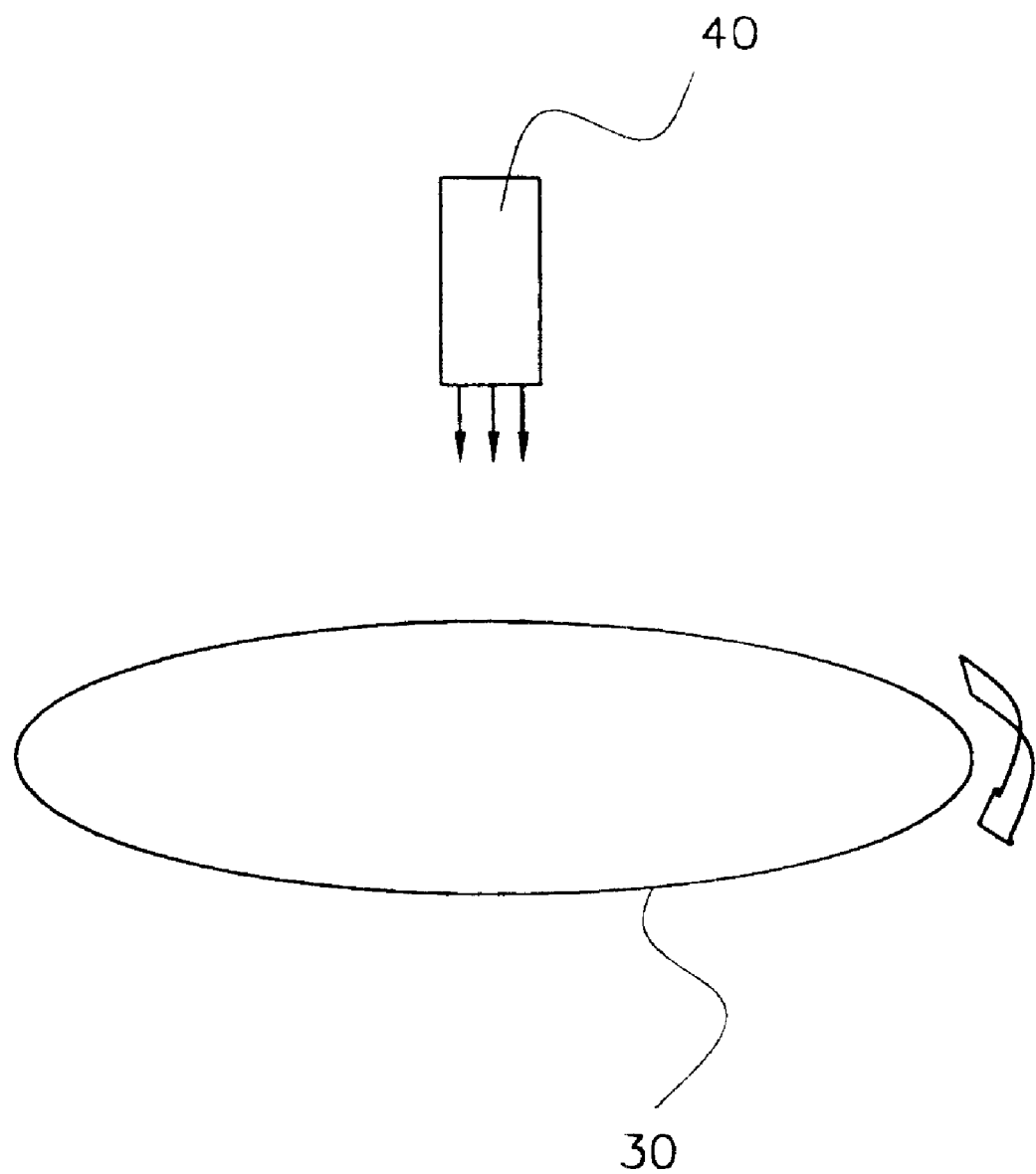
FIG. 3 illustrates the method of forming a damascene metal gate according to the present invention.

Referring to FIG. 3, a dummy polysilicon layer is removed using a spin etch process. The spin etch is a dynamic wet etch process to remove a dummy polysilicon layer by rotating a wafer (30) and providing wet chemicals to the surface of the wafer (30) through a chemical provider (40).

Figure 4A:
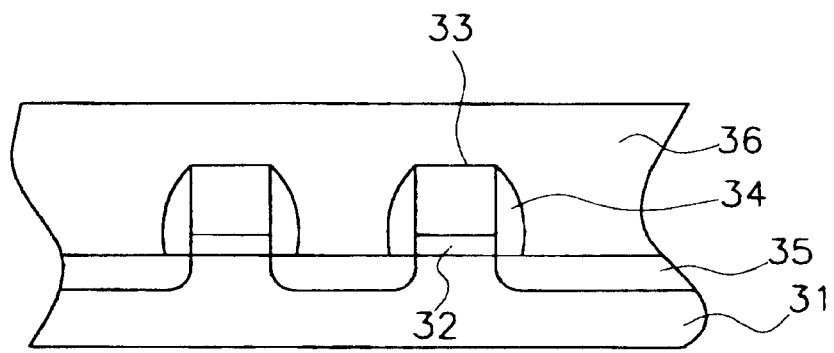
FIGS. 4A to 4C illustrate the manufacturing processes for forming a damascene metal gate according to a preferred embodiment of the present invention.
Figure 4B:
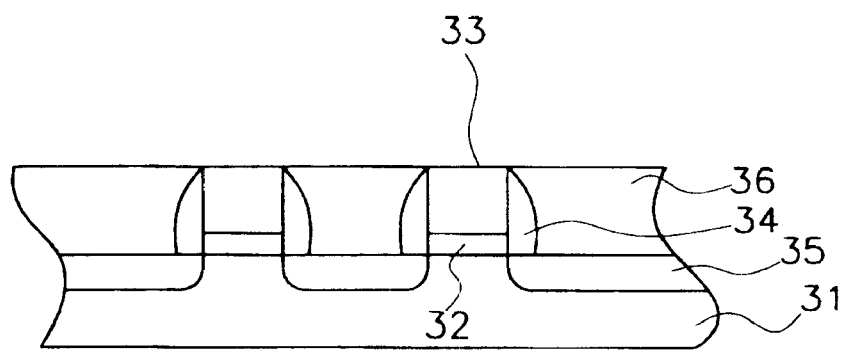
Figure 4C:
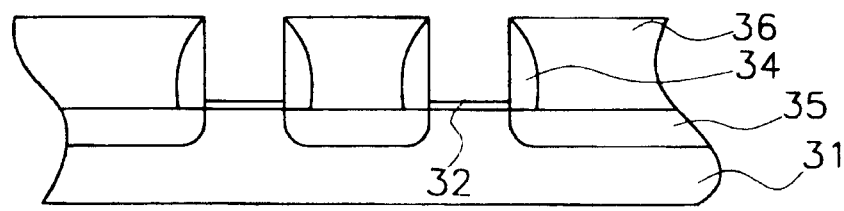

FIGS. 4A to 4C show a method of forming a damascene metal gate according to a preferred embodiment of the present invention.

First, a dummy gate oxide layer (32) and a dummy polysilicon layer (33) are formed on a wafer, i.e., silicon substrate (31) and etched to form a dummy gate. Sidewall spacers (34) and source/drain regions are then formed. Subsequently, an interlayer insulation layer (36) is formed on the surface of the resulting structure. The source/drain regions may be formed in a LDD structure by implanting dopant both before and after the sidewall spacers (34) are formed.

Referring to FIG. 4B, a top portion of the interlayer insulating layer (36) is removed using a CMP process to expose a surface of the dummy polysilicon layer (33).

Referring to FIG. 4C, the dummy polysilicon layer (33) is rapidly removed by rotating a semiconductor substrate (31) having a dummy polysilicon in accord with FIG. 3 while providing wet chemicals to the surface of the wafer.

Thereafter, although it is not shown in drawings, the remainder of the dummy gate oxide layer is removed and a damascene gate insulating layer and damascene metal gate are then formed.

Figure 5:
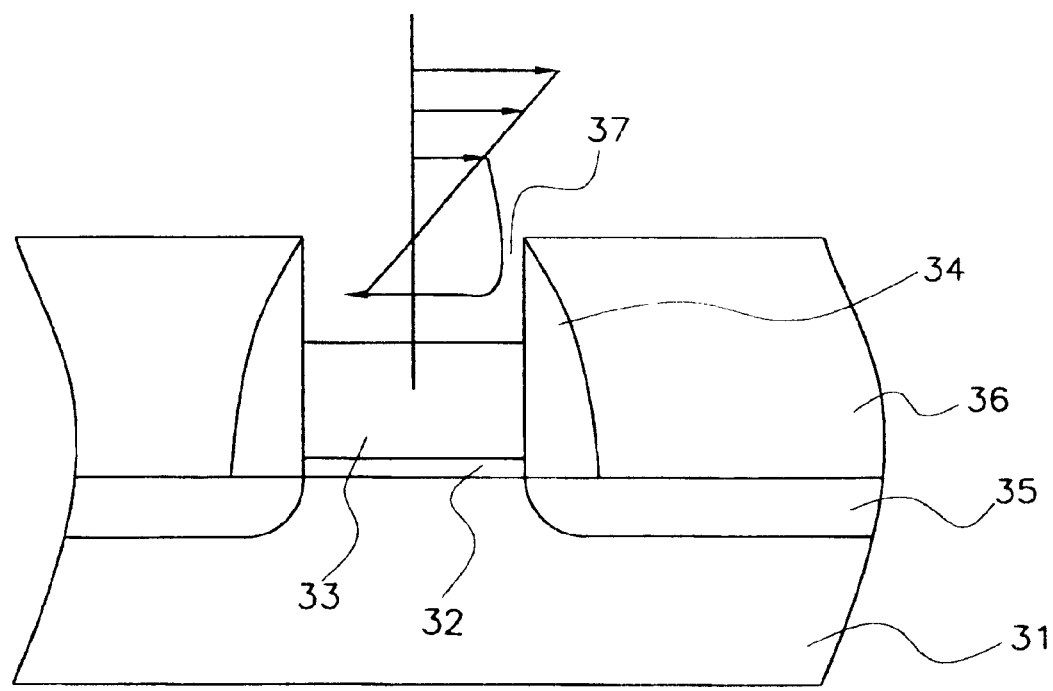
FIG. 5 illustrates a method of removing a dummy polysilicon layer according to the present invention.

FIG. 5 is a drawing illustrating a method of removing a dummy polysilicon layer using a spin etch process according to the present invention.

Figure 1A:
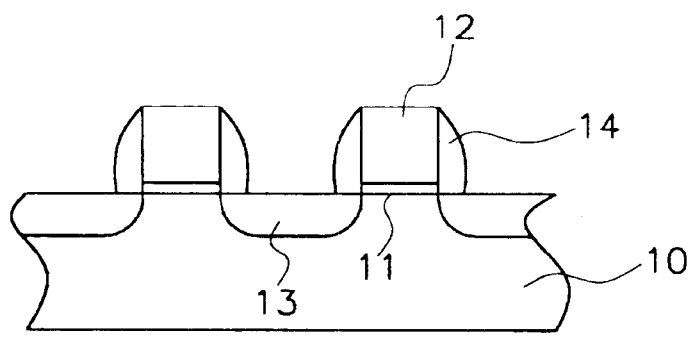
FIGS. 1A to 1F illustrate conventional manufacturing processes of forming a damascene metal gate.
Figure 1B:
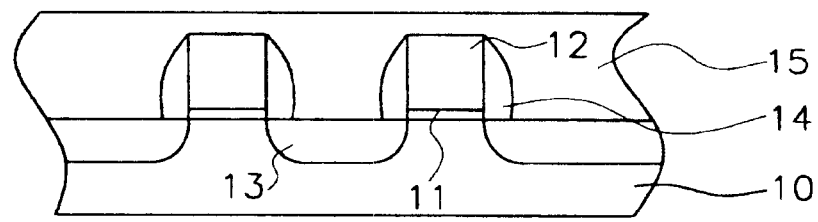
Figure 1C:
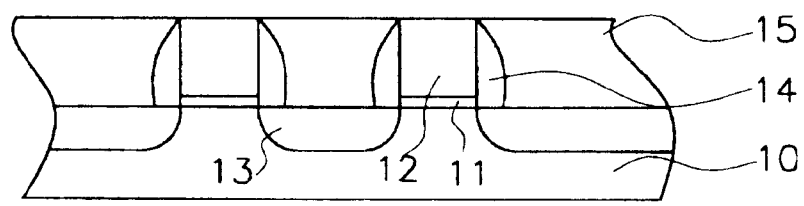
Figure 1D:
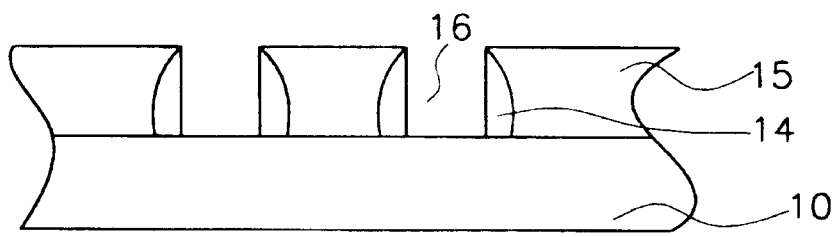
Figure 1E:
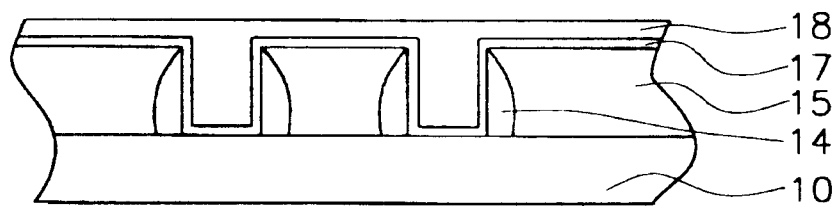
Figure 1F:
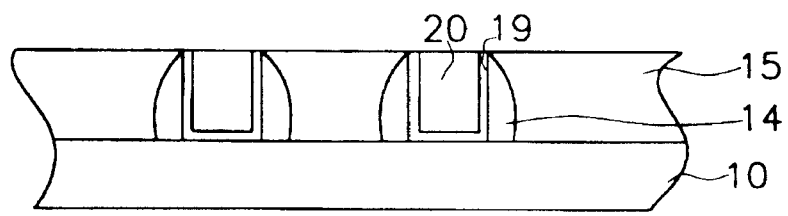
Figure 2A:
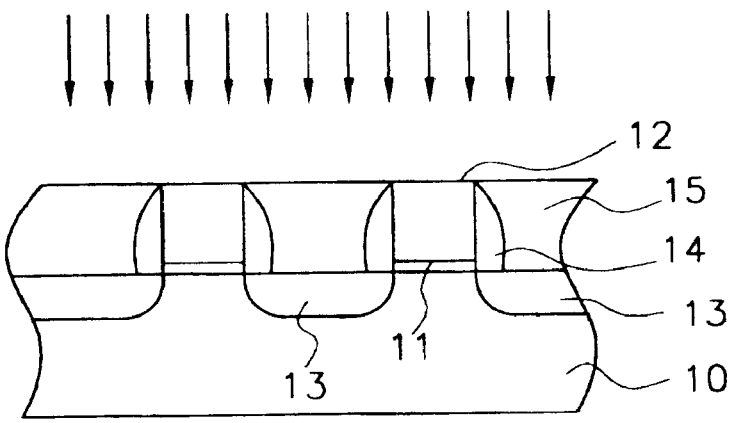
FIGS. 2A and 2B are drawings illustrating alternative etch methods removing the dummy polysilicon layer in a conventional method of forming a damascene metal gate.
Figure 2B:
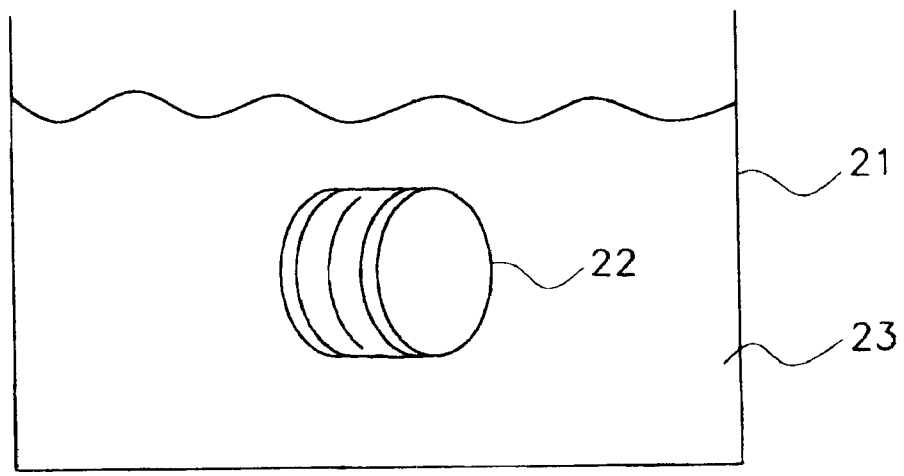

The drawing shows a flow of wet chemicals on a rotating semiconductor substrate (31). The direction and length of arrow correspond generally to the direction and velocity of the flow of the wet chemicals. Unlike the conventional method illustrated in FIG. 2B, wet chemicals are coated onto and moved across the surface of the wafer, thereby etching the dummy polysilicon layer (33). Here, the etch rate depends on the flow speed of etching chemicals and it depends on the rpm (rotation per min) of the semiconductor substrate (31).

When a wafer rotates more than 2000 rpm, wet chemicals also move rapidly across the wafer as a result both of the rotation angular velocity and the centripetal angular velocity. In the trench (37), which is being formed by removing a dummy polysilicon layer, wet chemicals move rapidly to the edges of wafer. When the wafer rotates too rapidly, most of chemicals pass over the damascene trench (37) and only a part of chemicals flow into the trench.

The etching chemicals in the trench cause eddy flow due to its rapid flow rate and tend to stagnate in the trench. Therefore, it is impossible to introduce fresh chemical etch solution into the trench and the polysilicon layer in the trench is not removed efficiently.

When a wafer rotates at the rate of 500–2000 rpm, the dummy polysilicon layer is removed more effectively than provided by rapid rotation or static dip etching. That is, when a wafer rotates at a sufficiently slow rate (500–2000 rpm), the wet etch solution is allowed to flow into the trench (37) and accordingly, the eddy flow in the trench is reduced. Therefore, it is possible to introduce fresh wet chemical etch solution into the trenches being etched into the wafer surface. Moreover, the chemicals flowing into the trench increase the etch rate of polysilicon layer as a result of the mechanical agitation forces induced by the rotation.

Table 1 provides a comparison of the conditions for removing a dummy polysilicon layer using a spin etch process of the present invention and conventional wet etch process.

| | Conventional wet etching | Spin etching of the present invention |
|---|---|---|
| Experimental condition | $NH_4OH:H_2O$ = 1:2–1:20<br>Temperature: 86° C.<br>Dipping into a wet bath | $HF:HNO_3$ = 1:20<br>Temperature: 23° C.<br>Rotation speed of wafer: 500–2000 rpm (desirably 1400 rpm)<br>Flow rate of chemicals: 0.3–1.3 lpm |

-continued

|  | Conventional wet etching | Spin etching of the present invention |
|---|---|---|
| Etching speed of layers (Å/min) | Polysilicon: 90<br>Thermal oxide layer (SiO$_2$): 0.2<br>CVD oxide layer (HDP SiO$_2$): 0.3–1<br>Nitride layer (Si$_3$N$_4$): 0.3–1 | Polysilicon: 12,000<br>Thermal oxide layer (SiO$_2$): 540<br>CVD oxide layer (HDP SiO$_2$): 700<br>Nitride layer (Si$_3$N$_4$): 60 |
| Etching selection ratio to polysilicon layer | Thermal oxide layer (SiO$_2$) is 450:1<br>CVD oxide layer (HDP SiO$_2$) is 90–300:1<br>Nitride layer (Si$_3$N$_4$) is 90–300:1 | Thermal oxide layer (SiO$_2$) is 22:1<br>CVD oxide layer (HDP SiO$_2$) is 17:1<br>Nitride layer (Si$_3$N$_4$) is 200:1 |

As shown in Table 1, according to a conventional method, the etching rate for the polysilicon layer is about 90 Å/min at a temperature of 86° C. in a wet etch bath comprising a NH$_4$OH+H$_2$O solution. However, according to a spin etching of the present invention, the etching speed of polysilicon layer is 12,000 Å/min at a temperature of 23° C. when solution of HF:HNO$_3$ with a mixture ratio of 1 to 20 is provided at a flow rate of 0.8 lpm (liter per min) and a wafer rotates at a speed of 1400 rpm.

Figure 6A:
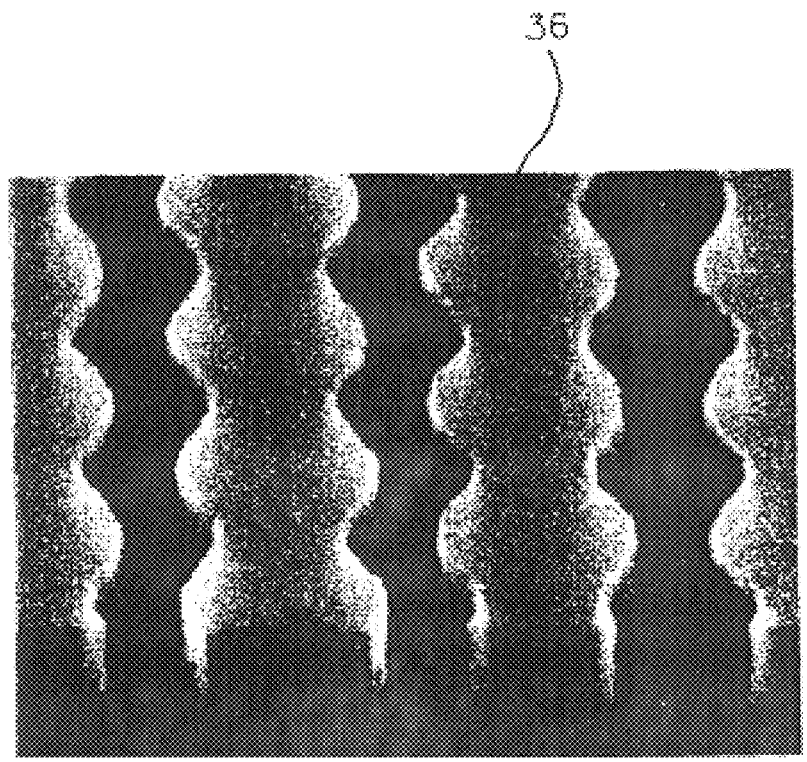
FIGS. 6A and 6B are electron micrographs of gate regions after removing a dummy polysilicon layer according to the present invention.
Figure 6B:
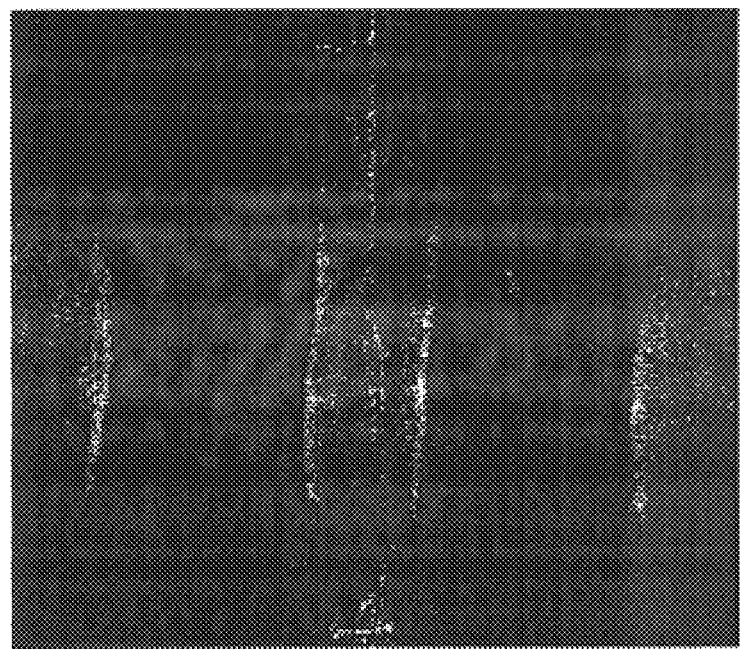

FIGS. 6A and 6B are electron micrographs for showing the result when the polysilicon layers of a trench is spin etched for 10 seconds under the experimental conditions of table 1. The FIGS. 6A and 6B are obtained by removing a dummy polysilicon layer of FIG. 4C. Here, FIG. 6A shows a narrow trench of memory cell area and FIG. 6B shows a wide trench of peripheral circuit area. As shown in FIGS. 6A and 6B, polysilicon layers were effectively removed in both the wide trench and the narrow trench at the same time by the present method.

Referring to Table 1, according to a spin etching of the present invention, the etching selection ratios of polysilicon to oxide and nitride are lowered than that of conventional method. However, it is advantageous in that it has not caused any damage on a substrate.

And, referring to FIGS. 6A and 6B, when the dummy polysilicon layer is removed by spin etching according to the present invention, the wafer does not exhibit any pattern collapse caused by the forces exerted on the rotating wafer.

In a spin etching process according to the present invention, it is preferred that the rotation speed of wafer is 500 to 2000 rpm, the mixture ratio of HF to HNO$_3$ in the wet etch solution is 1:10 to 1:50, the flow rate of chemicals is 0.3 to 2.0 liters per minute and a temperature of the chemical etch solution is 20 to 100° C.

As described above, according to the present invention, a dummy polysilicon layer is removed much more rapidly than is possible with a conventional wet etching process, by using a spin etch process, in which the wafer is rotated as the wet etch chemicals are applied to the wafer surface.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of selectively etching a semiconductor wafer comprising the steps of:
   forming a layer of a first material on a top surface of a semiconductor substrate;
   selectively removing portions of the first material to form a first pattern, the first pattern comprising an opening;
   forming a layer of a second material on the first pattern, the second material filling the opening;
   removing a top portion of the second material to expose a top surface of the first material and form a plug of the second material in the opening;
   spin etching the semiconductor wafer to remove at least a portion of the plug of the second material from the opening to form a trench, wherein a liquid etch composition is applied to a top surface while the semiconductor wafer is being rotated.

2. A method of selectively etching a semiconductor wafer according to claim 1 wherein:
   during the spin etching step the liquid etch composition is applied to the surface of the wafer at varying radial positions.

3. A method of selectively etching a semiconductor wafer according to claim 1 wherein:
   the first material is an insulator and the second material is a semiconductor.

4. A method of selectively etching a semiconductor wafer according to claim 1 wherein:
   the first material is an oxide and the second material is polysilicon.

5. A method of selectively etching a semiconductor wafer according to claim 1 wherein:
   during the spin etching step, the wafer is rotated at a rate sufficient to mechanically agitate a portion of the liquid etch composition located in the trench.

6. A method of selectively etching a semiconductor wafer according to claim 1 wherein:
   during the spin etching step, the wafer is rotated at a rate sufficient to cause a portion of the liquid etch composition being applied to the surface of the wafer to displace a portion of the previously applied liquid etch composition located in the trench.

7. A method of selectively etching a semiconductor wafer according to claim 1 wherein:
   during the spin etching step the liquid etch composition produces an etch selectivity of at least 10:1 between the first material and the second material.

8. A method of selectively etching a semiconductor wafer according to claim 7 wherein:
   during the spin etching step the liquid etch composition exhibits an etch selectivity of at least 15:1 between the first material and the second material.

9. A method of selectively etching a semiconductor wafer according to claim 1 wherein:
   during the spin etching step the liquid etch composition applied to the surface of the wafer comprises at least a first etch solution and a second etch solution applied sequentially to the surface of the wafer as the wafer is being rotated.

10. A method of selectively etching a semiconductor wafer according to claim 9 wherein:
    during the spin etching step the wafer is rotated at a rate rotation rate of 500–2000 rpm.

* * * * *